United States Patent
Yuan et al.

(10) Patent No.: US 11,539,023 B2
(45) Date of Patent: Dec. 27, 2022

(54) DISPLAY SUBSTRATE AND MANUFACTURING METHOD THEREOF, DISPLAY PANEL

(71) Applicants: HEFEI BOE JOINT TECHNOLOGY CO., LTD., Anhui (CN); BOE TECHNOLOGY GROUP CO., LTD., Beiijing (CN)

(72) Inventors: Zhidong Yuan, Beijing (CN); Yongqian Li, Beijing (CN); Can Yuan, Beijing (CN); Enming Xie, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 319 days.

(21) Appl. No.: 16/577,601

(22) Filed: Sep. 20, 2019

(65) Prior Publication Data

US 2020/0274092 A1    Aug. 27, 2020

(30) Foreign Application Priority Data

Feb. 27, 2019   (CN) .......................... 201910145857.5

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3246* (2013.01); *H01L 27/3262* (2013.01);
(Continued)

(58) Field of Classification Search
CPC ............. H01L 51/5246; H01L 27/3246; H01L 27/3262; H01L 27/3265; H01L 27/3276;
(Continued)

(56) References Cited

U.S. PATENT DOCUMENTS 9,620,531 B2   4/2017   Jin et al.
9,659,978 B2   5/2017   Xu et al.
(Continued)

FOREIGN PATENT DOCUMENTS

CN    101527306 A    9/2009
CN    103018991 A    4/2013
(Continued)

OTHER PUBLICATIONS

First Office Action dated Jan. 19, 2020, for corresponding Chinese application 201910145857.5.

*Primary Examiner* — Hoang-Quan Ho
(74) *Attorney, Agent, or Firm* — Nath, Goldberg & Meyer; Joshua B. Goldberg

(57) ABSTRACT

A display substrate and a manufacturing method thereof, and a display panel are provided. The display substrate includes a base substrate having a display region and a peripheral region adjacent to the display region, the peripheral region being provided therein with a gate driver-on-array circuit including a plurality of transistors and capacitors, all of the transistors are provided in a transistor region, at least a part of the plurality of capacitors are provided in a capacitor region, and the capacitor region is located on a side of the transistor region distal to the display region; and an encapsulation structure for encapsulating the display region and the transistor region together; the peripheral region further including a sealing region for arranging a sealing structure therein, the capacitor region is located in the sealing region,
(Continued)

and the sealing region is provided on a side of the encapsulation structure distal to the display region.

12 Claims, 2 Drawing Sheets

(52) U.S. Cl.
CPC ...... *H01L 27/3265* (2013.01); *H01L 27/3276* (2013.01); *H01L 51/56* (2013.01); *H01L 2227/323* (2013.01)

(58) Field of Classification Search
CPC ............... H01L 51/56; H01L 2227/323; H01L 51/5253; H01L 51/524; G09G 3/3208
See application file for complete search history.

(56) References Cited

U.S. PATENT DOCUMENTS

| | | | |
|---|---|---|---|
| 9,899,431 | B2 | 2/2018 | Li et al. |
| 2016/0118416 | A1* | 4/2016 | Yamazaki ........... H01L 27/1218 349/38 |

FOREIGN PATENT DOCUMENTS

| | | |
|---|---|---|
| CN | 202975549 U | 6/2013 |
| CN | 104483771 A | 4/2015 |
| CN | 104749806 A | 7/2015 |
| JP | 2004240963 A | 8/2004 |

\* cited by examiner

DISPLAY SUBSTRATE AND MANUFACTURING METHOD THEREOF, DISPLAY PANEL

CROSS-REFERENCE TO RELATED APPLICATION

The present application claims the priority to the Chinese Patent Application No. 201910145857.5, filed on Feb. 27, 2019, the disclosure of which is hereby incorporated by reference in its entirety.

TECHNICAL FIELD

The present disclosure generally relates to the field of display technology, and in particular, to a display substrate and a manufacturing method thereof, and a display panel.

BACKGROUND

A display substrate is generally divided into a display region and a peripheral region. The display region is provided with a display structure, and the peripheral region is usually provided with a gate drive circuit including a large number of signal lines, transistors, and capacitors. In order to ensure the encapsulation effect, a sealing structure is generally provided at the edge of the display substrate and an encapsulation structure is provided at a position adjacent to the display region.

SUMMARY

The present disclosure provides a display substrate and a manufacturing method thereof, and a display panel.

The display substrate includes: a base substrate having a display region and a peripheral region adjacent to the display region, the peripheral region being provided therein with a gate driver-on-array circuit including a plurality of transistors and a plurality of capacitors, the peripheral region includes a transistor region and a capacitor region, all of the plurality of transistors are provided in the transistor region, at least a part of the plurality of capacitors are provided in the capacitor region, and the capacitor region is located on a side of the transistor region distal to the display region; an encapsulation structure for encapsulating the display region and the transistor region; and the peripheral region further includes a sealing region for arranging a sealing structure therein, the capacitor region is located in the sealing region, and the sealing region is provided on a side of the encapsulation structure distal to the display region.

In an embodiment, all of the capacitors are provided in the capacitor region.

In an embodiment, the gate driver-on-array circuit further includes a plurality of signal lines, and at least a part of the plurality of signal lines are arranged in the sealing region.

In an embodiment, the plurality of signal lines include at least one first signal line, the sealing region further includes a first lead region located on a side of the capacitor region distal to the display region, and the at least a part of the plurality of signal lines includes the first signal line located in the first lead region.

In an embodiment, the plurality of signal lines further includes at least one second signal line, the peripheral region further includes a second lead region located between the transistor region and the display region, and the at least one second signal line is located in the second lead region and is encapsulated by the encapsulation structure.

In an embodiment, the at least one first signal line is a clock signal line, and the at least one second signal line is a voltage signal line.

In an embodiment, the display substrate further includes: a protection layer arranged at least between the encapsulation structure and the plurality of transistors and between the encapsulation structure and the at least one second signal line.

In an embodiment, the encapsulation structure encapsulates the plurality of transistors and the protection layer above the plurality of transistors, and includes a portion extending on the base substrate which extends beyond an orthographic projection of an edge of the protection layer on the base substrate.

In an embodiment, an orthographic projection of the encapsulation structure on the base substrate does not overlap with an orthographic projection of the sealing structure on the base substrate.

In an embodiment, the sealing structure encapsulates the capacitors in the capacitor region and the at least one first signal line in the first lead region, and includes a portion extending on the base substrate which extends beyond an orthographic projection of the first lead region on the base substrate.

In an embodiment, the display region is provided with an organic light emitting diode, and the protection layer is an extending layer of a pixel definition layer in the display region.

In an embodiment, the encapsulation structure includes an inorganic material.

In an embodiment, the sealing region is arranged to surround the display region and the transistor region.

The present disclosure further provides a manufacturing method of a display substrate including: forming a gate driver-on-array circuit on a base substrate, wherein the base substrate is divided into a display region and a peripheral region, the gate driver-on-array circuit is provided in the peripheral region, the peripheral region includes a transistor region and a capacitor region located on a side of the transistor region distal to the display region, the gate driver-on-array circuit includes a plurality of transistors and a plurality of capacitors, all of the plurality of transistors are provided in the transistor region, at least a part of the plurality of capacitors are provided in the capacitor region; forming an encapsulation structure to encapsulate the display region and the transistor region; and providing in a sealing region a sealing structure for encapsulating the capacitors in the capacitor region, wherein the sealing region is provided on a side of the encapsulation structure distal to the display region.

In an embodiment, prior to the step of forming the encapsulation structure, the manufacturing method further includes forming a protection layer on the plurality of transistors, wherein the step of the forming the encapsulation structure to encapsulate the display region and the transistor region includes: encapsulating the display region and the plurality of transistors in the transistor region and the protection layer thereon.

In an embodiment, the step of forming the gate driver-on-array circuit on the base substrate further includes: forming at least one first signal line and at least one second signal line on the base substrate, the at least one first signal line is provided in a first lead region located on a side of the capacitor region of the sealing region distal to the display region, and the at least one second signal line is provided in a second lead region located between the transistor region and the display region, and the step of forming the encapsulation structure to encapsulate the display region and the transistor region includes: encapsulating the display region and the plurality of transistors in the transistor region, the at least one second signal line in the second lead region and the protection layer thereon; and the step of providing in the sealing region the sealing structure for encapsulating the capacitors in the capacitor region includes: providing in the sealing region the sealing structure for encapsulating the capacitors in the capacitor region and the at least one first signal line in the first lead region.

The present disclosure further provides a display panel including: the display substrate as described above; a cover plate opposite to the display substrate; and the sealing structure located in the sealing region and arranged to surround the display region of the display substrate to connect the peripheral region of the display substrate and a peripheral region of the cover plate together so as to seal an internal structure of the sealing region of the display substrate.

In an embodiment, the sealing structure includes sealant, and the encapsulation structure is arranged to be spaced apart from the cover plate.

DETAILED DESCRIPTION

Figure 1:
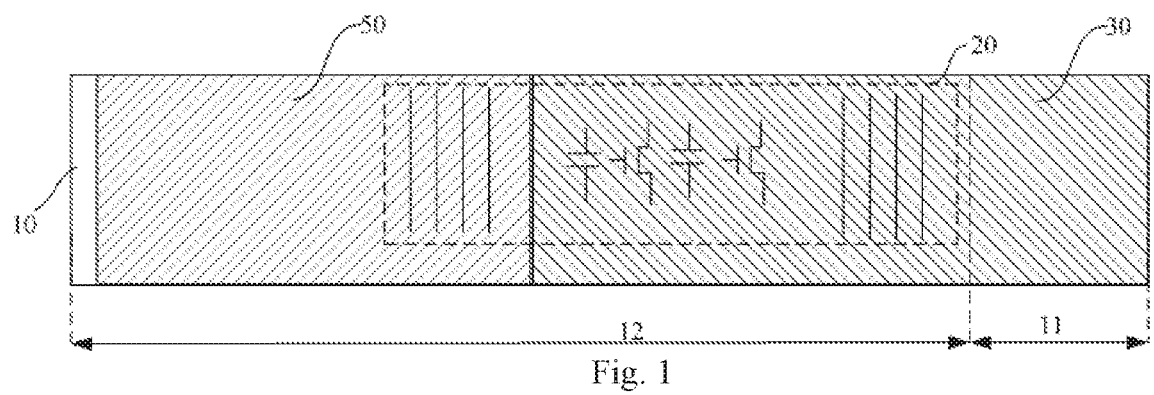
FIG. 1 is a schematic top view of a display substrate in the related art.

The present disclosure will be further described in detail below in conjunction with the accompanying drawings. Throughout the drawings, the same elements are denoted by like reference numerals. For the sake of clarity, various parts of the drawings may not be drawn to scale. In addition, some well-known parts may not be shown in the figure.

Many specific details of the disclosure, such as the structures, materials, dimensions, process technologies of the components, are described below in order to provide a clear understanding of the present disclosure. The present disclosure may be implemented without these specific details, as will be understood by those skilled in the art.

FIG. 1 is a schematic top view of a display substrate in the related art. As shown in FIG. 1, the display substrate includes a base substrate 10, and has a display region 11 and a peripheral region 12 connected to the display region 11. The peripheral region 12 is provided therein with a Gate Driver on Array (GOA) circuit 20. i.e., gate driver integral circuits (ICs) are integrated on the display substrate. The GOA circuit includes at least a plurality of signal lines, a plurality of transistors and a plurality of capacitors. A part of the plurality of signal lines, the plurality of transistors and the plurality of capacitors as well as the display structure in the display region 11 are encapsulated by an encapsulation structure 30 formed by a chemical vapor deposition process. That is, the encapsulation structure 30 encapsulates most of the GOA circuit (all transistors and all capacitors, a part of the signal lines). A sealing structure 50 (i.e. sealant) connects the peripheral regions of the display substrate and the cover plate together such that the various structures on the base substrate 10 are sealed between the base substrate 10 and the cover plate.

To ensure the encapsulation effect, the size of the sealant in the direction from the edge of the display substrate to the center of the display substrate (i.e., the width of the sealant) should not be too small. In addition, the direct contact between the sealant and the encapsulation structure 30 may affect the bonding effect, so the sealant does not overlap with the encapsulation structure 30.

Since the actual size of the peripheral region 12 of the display panel is the sum of the sizes of the frame sealant and most of the structure of the GOA circuit, it is large. Therefore, the display panel cannot achieve the narrow frame effect that is desired by the user.

Figure 2:
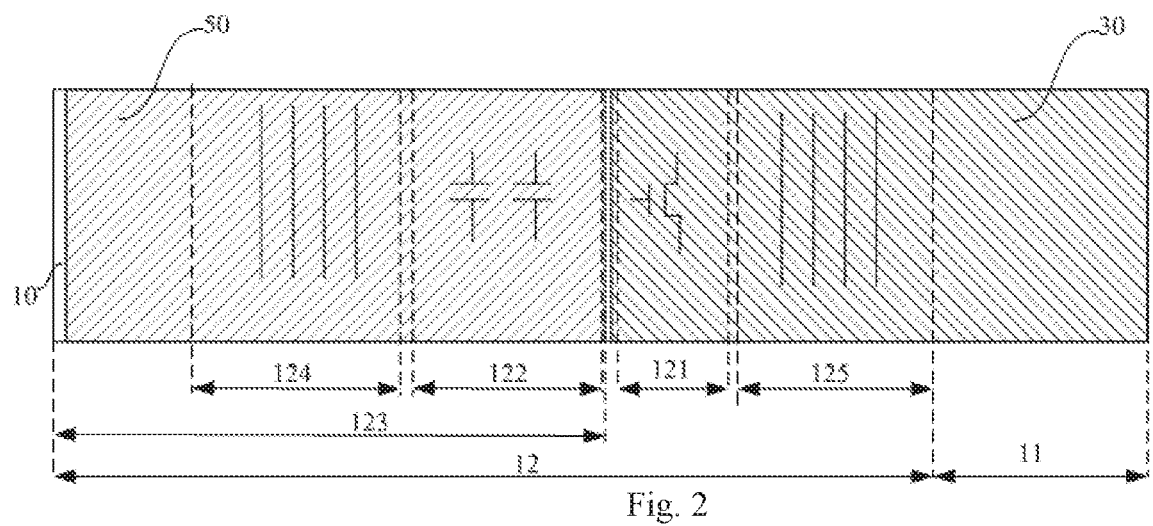
FIG. 2 is a schematic top view of a display substrate according to an embodiment of the present disclosure.
Figure 3:
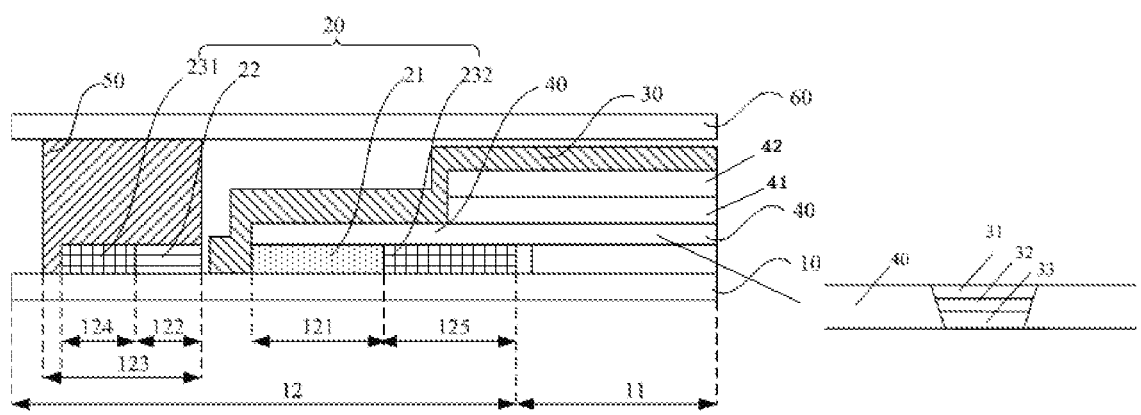
FIG. 3 is a schematic cross-sectional view of a display panel according to an embodiment of the present disclosure.

FIG. 2 is a schematic top view of a display substrate according to an embodiment of the present disclosure; FIG. 3 is a schematic cross-sectional view of a display panel according to an embodiment of the present disclosure. As shown in FIGS. 2 and 3, for the sake of clarity, the sealing structure 50 is also shown in FIG. 2.

The display substrate according to the embodiment of the present disclosure may include a base substrate 10 having a display region 11 and a peripheral region (i.e., a gate driver-on-array circuit layout (GOA Layout)) 12 adjacent to the display region 11. The peripheral region 12 may have a gate driver-on-array circuit (GOA) 20 provided therein. The gate driver-on-array circuit 20 may include a plurality of transistors (TFT) 21 and a plurality of capacitors 22, all the transistors 21 are provided in the transistor region (i.e., the TFT layout) 121, at least a part of the capacitors 22 are provided in the capacitor region 122, and the capacitor region 122 is located on a side of the transistor region 121 distal to the display region 11. For example, the transistors 21 each may be a thin film transistor. The encapsulation structure 30 may encapsulate the display region 11 and the transistor region 121. In the peripheral region 12, there is further provided a sealing region 123 for arranging a sealing structure (Seal) 50. The capacitor region 122 is located in the sealing region 123, and no part of the encapsulation structure 30 is included in the sealing region 123.

That is to say, the display substrate according to the embodiment of the present disclosure has the display region 11 for arranging the display structure therein and the peripheral region 12 located around the display region 11. Specifically, the peripheral region 12 may be arranged to surround the display region 11. In the present embodiment, only the peripheral region 12 provided with the gate driver-on-array circuit 20 is described. For example, if the gate driver-on-array circuit 20 may be provided on the left and right sides outside the display region 11, the peripheral region 12 described below may represent a region located on the left and right sides outside the display region 11.

The peripheral region 12 includes the capacitor region 122 in which the capacitors 22 of the gate driver-on-array circuit 20 are provided, and the transistor region 121 in which the transistors 21 of the gate driver-on-array circuit 20 are provided. That is to say, at least a part of the capacitors 22 in the gate driver-on-array circuit 20 are provided collectively together, and all the transistors 21 in the gate driver-on-array circuit 20 are provided collectively together.

The capacitors 22 on a side of the transistor region 121 distal to the display region 11 are located in the sealing region 123. After the sealing structure 50 is provided in the sealing region 123, at least a part of the capacitors 22 may be covered by the sealing structure 50.

In an embodiment, all the capacitors 22 are provided in the capacitor region 122, that is, all the capacitors 22 may be covered by the sealing structure 50.

Due to the properties of the materials of the sealing structure 50 and the encapsulation structure 30, the direct contact between the sealing structure 50 and the encapsulation structure 30 will affect the bonding effect of the sealing structure 50. Thus, the sealing structure 50 and the encapsulation structure 30 do not overlap with each other, or have a very small spacing therebetween (the spacing can be ignored).

It should be noted that, the display substrate according to the embodiment of the present disclosure is ultimately required to be aligned and assembled with a cover plate 60 to form a display panel. The sealing structure 50 provided in the sealing region 123 is used for connecting the display substrate and the cover plate 60 so that various elements/parts on the display substrate are sealed between the display substrate and the cover plate 60. In addition, to ensure the encapsulation effect, a size of the sealing structure 50 in a direction from the peripheral region 12 to the display region 11 in the display substrate (i.e., a width of the sealing structure 50) is a predetermined size (such as 3000 μm). Specifically, the sealing structure 50 may include sealant or may be any other suitable sealing structure.

FIG. 1 is a schematic top view of the display substrate in the related art. As shown in the display substrate of FIG. 1, the capacitors and the transistors in the gate driver-on-array circuit are arranged to be mixed together, and there are no respective regions for the transistors and the capacitors. In order to facilitate encapsulation of all the transistors in the encapsulation structure 30, the capacitors mixed with the transistors are also encapsulated together in the encapsulation structure 30. Thus, the capacitors in the gate driver-on-array circuit are not located in the sealing region 123, but are encapsulated in the encapsulation structure 30.

Compared with this, in the display substrate according to the embodiment of the present disclosure, all the transistors 21 in the gate driver-on-array circuit 20 are collectively arranged together, and all the capacitors 22 are collectively arranged together. This makes it easy for the encapsulation structure 30 to encapsulate only all the transistors 21 without encapsulating the capacitors 22 (all the capacitors 22 are arranged in the region where the sealing structure 50 is located). Under the premise that the size of the sealing structure 50 is a predetermined size and the size of the entire gate driver-on-array circuit 20 is constant, the capacitors 22 in the present embodiment are arranged in a different region compared with that in the related art. That is, the capacitors 22 are encapsulated by the sealing structure 50 instead of by the encapsulation structure 30, so that the number of the elements/parts that need to be encapsulated by the encapsulation structure 30 is reduced, thereby the size of the encapsulation structure 30 can be reduced (the region to be reduced is at least the capacitor region 122); moreover, since the size of the sealing structure 50 will not be increased by providing the capacitor region 122 (i.e., the size of the sealing structure 50 is constant), the overall size of the peripheral region 12 can be reduced, which reduces the process cost, optimizes the edge design, and achieves a narrow bezel of the display substrate.

Specifically, in the display substrate according to the embodiment of the present disclosure, the size of the peripheral region 12 of the display substrate is in fact the sum of the width of the sealing structure 50 and the size of the portion of the gate driver-on-array circuit 20 (i.e., the width of a portion of the encapsulation structure 30 located in the peripheral region 12). For example, as shown in FIG. 3, the width of the portion of the encapsulation structure 30 located in the peripheral region 12 may be at least 4140 μm, and the width of the sealing structure 50 is 3000 μm, thus the size of the peripheral region 12 is at least 7140 μm. In a case that the total width of the gate driver-on-array circuit 20 is 6168 μm, the width of the capacitor region 122 is 500 μm to 1000 μm, which is equivalent to the fact that the peripheral region 12 in the display substrate according to the embodiment of the present disclosure is reduced by at least 500 μm to 1000 μm.

In an embodiment, the gate driver-on-array circuit 20 further includes a plurality of signal lines, in which at least a part of the signal lines are located in the sealing region 123. For example, some signal lines may be located in the sealing region 123, while others may be encapsulated by the encapsulation structure 30. That is, the encapsulation structure 30 encapsulates the transistors 21 of the gate driver-on-array circuit 20 and a part of the signal lines. Optionally, all the signal lines may be located in the sealing region 123, that is, the encapsulation structure 30 encapsulates only the transistors 21 of the gate driver-on-array circuit 20.

It will be appreciated that, the signal lines mentioned in the present disclosure refer to lines for providing signals to the gate driver-on-array circuit 20, and the encapsulated signal liens may be connected to other elements (such as the capacitors 22, the transistors 21, etc.) via other lines.

Compared with the encapsulation structure 30 in the display substrate of the related art in which part of the signal lines, capacitors and transistors are encapsulated, the encapsulation structure 30 in the display substrate according to the embodiment has a small amount of elements/parts encapsulated therein, which further reduces the size of the encapsulation structure 30, and therefore the entire size of the peripheral region 12, achieving the narrow bezel of the display substrate.

Specifically, the signal lines may include a first signal line 231 located in a first lead region (CLK layout) 124. The first lead region 124 is located on a side of the transistor region 121 distal to the display region 11, and the first lead region 124 is located in the sealing region 123. For example, it is conceivable that all signal lines are the first signal lines 231, and they are collectively arranged together in the first lead region 124. Optionally, it is conceivable that the first signal lines 231 are a part of the signal lines, and the part of the signal lines are collectively arranged together in the first lead region 124.

For example, the first signal line 231 is a clock signal line (CLK).

In an embodiment, the first lead region 124 is located on a side of the capacitor region 122 distal to the display region 11.

For example, in the case that the first signal line 231 is a clock signal line, due to the requirement of the actual connection of the clock signal line, the complexity of the wiring of the gate driver-on-array circuit 20 can be reduced by arranging the first signal line 231 on a side of the capacitor region 122 distal to the display region 11, thereby improving the preparation efficiency.

The signal lines may further include a second signal line 232 located in a second lead region 125 (VGL layout). The second lead region 125 is located between the transistor region 121 and the display region 11, and is encapsulated by the encapsulation structure 30. That is to say, in a case that the first signal line 231 is a part of the signal lines, the second signal line 232 is another part of the signal lines.

For example, the second signal line 232 is a voltage signal line (VGL).

For example, due to the requirement of the actual connection of the voltage signal line, the complexity of the wiring of the gate driver-on-array circuit 20 can be reduced by arranging the second signal line 232 between the transistor region 121 and the display region 11, thereby improving the preparation efficiency.

In an embodiment, the display substrate according to the embodiment of the present disclosure may further include a protection layer 40 (an extension layer of the pixel definition layer of the display region) which is located at least between the encapsulation structure 30 and the transistor 21.

For example, since the preparation procedure of the encapsulation structure 30 may affect the property of the active layer of the transistor 21, it is necessary to form a protection layer 40 covering the transistor 21 after the transistor 21 is formed and before the encapsulation structure 30 is formed, so as to protect the active layer of the transistor 21 from being affected by the preparation process of the encapsulation structure 30. The encapsulation structure 30 also encapsulates the protection layer 40. Thus, the edge of the encapsulation structure 30 must extend beyond the edge of the protection layer 40. Specifically, the encapsulation structure 30 extends over the substrate 10 beyond an orthographic projection of the edge of the protection layer 40 on the substrate 10 by 500 μm.

Specifically, the encapsulation structure 30 may be formed by the chemical vapor deposition (CVD) method. For example, the encapsulation structure 30 may be an encapsulation structure including an inorganic material. The encapsulation structure 30 formed by the CVD method has a better encapsulation performance.

It should be noted that, to ensure the performance of the transistor 21, the transistor 21 must be encapsulated by the encapsulation structure 30 instead of being covered by the sealing structure 50. Thus, the transistor 21 according to the embodiment of the present disclosure cannot be arranged in the sealing region 123. Accordingly, in the present application, the transistor 21 and the capacitor 22 are located in the transistor region encapsulated by the encapsulation structure and the capacitor region encapsulated by the sealing structure, respectively, which can reduce the size of the encapsulation structure while ensuring that the sealing structure is large enough to ensure the encapsulation effect, thereby achieving a narrow bezel of the display substrate.

For example, the display substrate may be an organic light emitting diode display substrate, and the protection layer 40 is the pixel definition layer. Specifically, the display structure in the display region 11 of the display substrate includes a cathode 31, an anode 33 and an organic light emitting layer 32. The display region 11 is further provided therein with elements/parts such as insulation layers 41, 42 and the like. FIG. 3 merely exemplarily shows that a display device such as the organic light emitting diode may be included in the display region 11. In a practical application, the anodes 33 of a plurality of sub-pixels are generally discrete, while the cathodes 31 of the plurality of sub-pixels are generally coupled electrically together. Specifically, in the organic light emitting diode display substrate, the pixel definition layer is used to define different light emitting elements/parts. When forming the pixel definition layer, the pixel definition layer may extend to the transistor region 121 of the peripheral region 12, and cover the transistors 21 of the gate driver-on-array circuit 20 so as to protect the transistors 21.

This can simplify the preparation process of the display substrate according to the embodiment of the present disclosure, thereby improving the preparation efficiency and saving the manufacturing cost.

Figure 4:
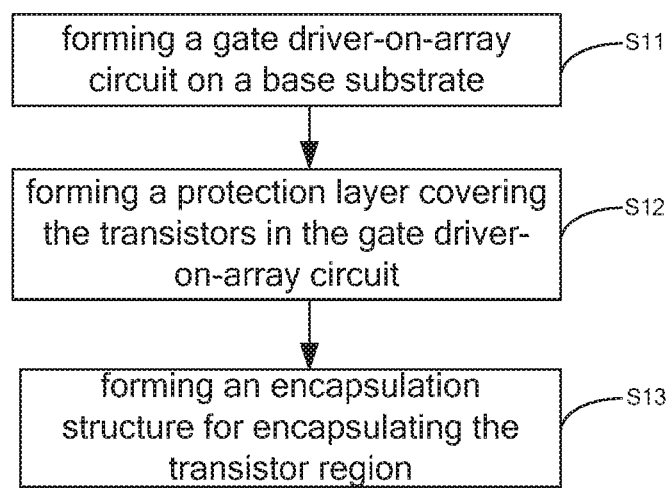
FIG. 4 is a flow chart of a manufacturing method of a display substrate according to an embodiment of the present disclosure.

As shown in FIGS. 2 to 4, an the embodiment of the present disclosure provides a manufacturing method of a display substrate (for example, the display substrate in the above embodiment) which includes: S11, forming a gate driver-on-array circuit 20 on a base substrate 10; S12, forming a protection layer 40 covering the transistors 21 in the gate driver-on-array circuit 20; and S13, forming an encapsulation structure 30 for encapsulating the transistor region 121.

Specifically, in the display substrate according to the embodiment of the present disclosure, all the transistors 21 in the gate driver-on-array circuit 20 are collectively arranged together, and all the capacitors 22 in the gate driver-on-array circuit 20 are collectively arranged together. This makes it easy for the encapsulation structure 30 to encapsulate only all the transistors 21 without encapsulating the capacitors 22 (all the capacitors 22 are arranged in the region where the sealing structure 50 is located). Under the premise that the size of the sealing structure 50 is a predetermined size and the size of the entire gate driver-on-array circuit 20 is constant, the capacitors 22 according to the embodiment of the present disclosure are arranged in a different region compared with that in the related art, that is, the capacitors 22 are covered by the sealing structure 50, so that the number of the elements/parts that need to be encapsulated by the encapsulation structure 30 is reduced, thereby the size of the encapsulation structure 30 can be reduced (the size to be reduced is at least the size of the capacitor region 122), and thus the overall size of the peripheral region 12 can be reduced, the manufacturing cost is reduced, the edge design is optimized, and a narrow bezel of the display substrate is achieved.

As shown in FIGS. 2 and 3, the embodiment of the present disclosure provides a display panel which includes: the display substrate in the above embodiment; the sealing structure 50 which is located in the sealing region 123 and is arranged to surround the display region 11 of the display substrate; a cover plate 60 which is connected to the display substrate by the sealing structure 50 so as to encapsulate elements/parts on the base substrate 10 between the display substrate and the cover plate 60.

Specifically, the display panel according to the embodiment of the present disclosure may be any product or component having a display function, such as an organic light emitting diode (OLED) display panel, an electronic paper, a mobile phone, a tablet, a television, a display, a notebook computer, a digital photo frame, a navigator, and so on.

It should be noted that, the terms such as "first" and "second" are merely used herein to distinguish one entity or operation from another, without necessarily requiring or implying that there is any such actual relationship or order between these entities or operations. Furthermore, the term "comprise" or "include" or any other variation thereof is intended to encompass a non-exclusive inclusion, such that a process, method, article, or device including a plurality of elements includes not only those elements but also other elements not explicitly listed, or elements that are inherent to the process, method, article, or device. In the absence of more restrictions, elements defined by the phrase "including a . . . " does not exclude the presence of other identical element(s) in the process, method, article or device.

The embodiments according to the present disclosure are as described above. Not all the details of the embodiments are described, and the disclosure is not limited to the specific embodiments as described. Obviously, many modifications and variations may be made on the basis of the above. These embodiments are selected and described in detail in the specification in order to explain the principles and practical applications of the invention and the invention so that those skilled in the art can make a good use of the present disclosure and the modifications based on the present disclosure. The present disclosure is to be limited only by the scope of the appended claims and the equivalents thereof.

What is claimed is:

1. A display substrate, comprising: a base substrate having a display region and a peripheral region adjacent to the display region, the peripheral region being provided therein with a gate driver-on-array circuit comprising a plurality of transistors and a plurality of capacitors, wherein the peripheral region comprises a transistor region and a capacitor region, all of the plurality of transistors are provided in the transistor region, at least a part of the plurality of capacitors are provided in the capacitor region, and the capacitor region is located on a side of the transistor region away from the display region; and
an encapsulation structure for encapsulating the display region and the transistor region;
wherein the peripheral region further comprises a sealing region for arranging a sealing structure therein, the capacitor region is located in the sealing region, and the sealing region is provided on a side of the encapsulation structure away from the display region;
wherein the gate driver-on-array circuit further comprises a plurality of signal lines, and at least a part of the plurality of signal lines are arranged in the sealing region;
the plurality of signal lines comprise at least one first signal line, the sealing region further comprises a first lead region located on a side of the capacitor region away from the display region, and the at least a part of the plurality of signal lines comprises the first signal line located in the first lead region;
the plurality of signal lines further comprises at least one second signal line, the peripheral region further comprises a second lead region located between the transistor region and the display region, and the at least one second signal line is located in the second lead region and is encapsulated by the encapsulation structure; and
the at least one first signal line is a clock signal line, and the at least one second signal line is a voltage signal line.

2. The display substrate of claim 1, wherein all of the capacitors are provided in the capacitor region.

3. The display substrate of claim 1 further comprising: a protection layer arranged at least between the encapsulation structure and the plurality of transistors, and between the encapsulation structure and the at least one second signal line.

4. The display substrate of claim 3, wherein the encapsulation structure encapsulates the plurality of transistors and the protection layer, and comprises a portion extending on the base substrate which extends beyond an orthographic projection of an edge of the protection layer on the base substrate.

5. The display substrate of claim 4, wherein an orthographic projection of the encapsulation structure on the base substrate does not overlap with an orthographic projection of the sealing structure on the base substrate.

6. The display substrate of claim 5, wherein the sealing structure encapsulates the capacitors in the capacitor region and the at least one first signal line in the first lead region, and comprises a portion extending on the base substrate which extends beyond an orthographic projection of the first lead region on the base substrate.

7. The display substrate of claim 6, wherein the display region is provided with an organic light emitting diode, and the protection layer is an extending layer of a pixel definition layer in the display region.

8. The display substrate of claim 1, wherein the encapsulation structure comprises an inorganic material.

9. The display substrate of claim 7, wherein the sealing region is arranged to surround the display region and the transistor region.

10. A manufacturing method of a display substrate, comprising:
forming a gate driver-on-array circuit on a base substrate, wherein the base substrate is divided into a display region and a peripheral region, the gate driver-on-array circuit is provided in the peripheral region, the peripheral region comprises a transistor region and a capacitor region located on a side of the transistor region away from the display region, the gate driver-on-array circuit comprises a plurality of transistors and a plurality of capacitors, all of the plurality of transistors are provided in the transistor region, at least a part of the plurality of capacitors are provided in the capacitor region;
forming an encapsulation structure to encapsulate the display region and the transistor region; and
providing in a sealing region a sealing structure for encapsulating the capacitors in the capacitor region, wherein the sealing region is provided on a side of the encapsulation structure away from the display region;
wherein prior to the step of forming the encapsulation structure, the manufacturing method further comprises forming a protection layer on the plurality of transistors,
wherein the step of the forming the encapsulation structure to encapsulate the display region and the transistor region comprises: encapsulating the display region and the plurality of transistors in the transistor region and the protection layer;
wherein the step of forming the gate driver-on-array circuit on the base substrate further comprises: forming at least one first signal line and at least one second signal line on the base substrate, the at least one first signal line is provided in a first lead region located on a side of the capacitor region of the sealing region away from the display region, and the at least one second signal line is provided in a second lead region located between the transistor region and the display region, and
the step of forming the encapsulation structure to encapsulate the display region and the transistor region comprises: encapsulating the display region and the plurality of transistors in the transistor region, the at least one second signal line in the second lead region and the protection layer; and
the step of providing in the sealing region the sealing structure for encapsulating the capacitors in the capacitor region comprises: providing in the sealing region the sealing structure for encapsulating the capacitors in the capacitor region and the at least one first signal line in the first lead region,
wherein the at least one first signal line is a clock signal line, and the at least one second signal line is a voltage signal line.

11. A display panel, comprising:

the display substrate of claim 1;

a cover plate opposite to the display substrate; and the sealing structure located in the sealing region and arranged to surround the display region of the display substrate to connect the peripheral region of the display substrate and a peripheral region of the cover plate together so as to seal an internal structure of the sealing region of the display substrate.

12. The display panel of claim 11, wherein the sealing structure comprises sealant, and the encapsulation structure is arranged to be spaced apart from the cover plate.

\* \* \* \* \*